United States Patent
Xiao et al.

(10) Patent No.: US 8,441,266 B1
(45) Date of Patent: May 14, 2013

(54) SENSING CIRCUIT

(75) Inventors: Ping Xiao, East Palo Alto, CA (US);
Weiying Ding, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 587 days.

(21) Appl. No.: 12/537,609

(22) Filed: Aug. 7, 2009

(51) Int. Cl.
*H01H 85/30* (2006.01)
*G01R 31/02* (2006.01)
*G08B 21/00* (2006.01)

(52) U.S. Cl.
USPC .......................... 324/550; 324/537; 340/638

(58) Field of Classification Search .................. 324/537, 324/500, 507, 550; 340/638; 73/1.42
See application file for complete search history.

(56) References Cited

U.S. PATENT DOCUMENTS

| | | | | |
|---|---|---|---|---|
| 5,955,910 | A * | 9/1999 | Levin et al. | 327/393 |
| 6,285,605 | B1 * | 9/2001 | Schrogmeier et al. | 365/200 |
| 8,098,074 | B2 * | 1/2012 | Do et al. | 324/550 |
| 2005/0212527 | A1 * | 9/2005 | Wu | 324/550 |

* cited by examiner

*Primary Examiner* — Hoai-An D Nguyen
(74) *Attorney, Agent, or Firm* — Ward & Zinna, LLC

(57) ABSTRACT

A sensing circuit for comparing current flow through a reference resistance with current flow through a resistive device under test (DUT) such as a fuse. The sensing circuit includes a comparator having a first PMOS transistor and a first NMOS transistor connected in series between a first input and a first node and a second PMOS transistor and a second NMOS transistor connected in series between a second input and the first node. The first PMOS and NMOS transistors are cross-coupled with the second PMOS and NMOS transistors. Specifically, a first output is connected to the first node to the gates of the second PMOS and second NMOS transistors and a second output is connected to the second node and to the gates of the first PMOS and first NMOS transistors. The reference resistance is connected to one of the inputs and the DUT is connected to the other input.

16 Claims, 3 Drawing Sheets

SENSING CIRCUIT

FIELD OF THE INVENTION

This relates to a sensing circuit. This circuit was developed to address problems encountered in sensing a programmed state of fuses such as polysilicon or copper fuses and will be described in that context. However, this circuit also has applications in sensing other devices under test.

BACKGROUND OF THE INVENTION

Fuses are widely used in semiconductor integrated circuits in both analog and digital circuits. For example, they can be used to store security codes, manufacturing data, device dependent data, redundant data, etc. A conventional integrated circuit might have 1000 or more fuses in its circuitry. Early fuses were metal based and were programmed by destroying the fuse with a laser beam. More recently, fuses have been developed that are electrically programmable using electromigration. See, for example, C. Kothandaraman et al., "Electrically Programmable Fuse (eFuse) Using Electromigration in Silicides," IEEE Electron Device Letters, Vol. 23, No. 9, pp. 523-525 (September 2002). Typically, the state of the fuse—unprogrammed (unblown or intact) or programmed (or blown)—is read out by determining the voltage drop across the fuse using a voltage divider network or its equivalent. It has been difficult, however, to use electrically programmable fuses in modern integrated circuits because the fuses use a bias voltage that requires them to be relatively large in size and they have a narrow window of sensitivity that does not work well across process, voltage and temperature variations. Other circuits, such as those disclosed in the assignee's U.S. Pat. No. 7,304,527 B1, compare the resistance of the blown or unblown fuse with a reference resistance and generate an output signal indicating whether the fuse is blown or not. U.S. Pat. No. 7,304,527 is incorporated by reference herein in its entirety.

While the circuit of the '527 patent has several advantages over the prior art, it still conducts a significant amount of DC current (approximately 0.5 mA) during the sensing operation. As a result, in an integrated circuit with a large number of fuses, the use of circuits such as that of the '527 patent to sense the fuses imposes a significant current drain. Accommodating the sensing current also impacts the design of the power buses on the integrated circuit.

SUMMARY OF THE INVENTION

The present invention is a sensing circuit with significantly reduced current requirements. The circuit compares current flow through a reference resistance with current flow through a resistive device under test (DUT). In a preferred embodiment, the sensing circuit comprises a comparator having first and second PMOS transistors and first and second NMOS transistors. The first PMOS transistor and the first NMOS transistor are connected in series between a first input and a first node; and the second PMOS transistor and the second NMOS transistor are connected in series between a second input and the first node. The gates of the first PMOS transistor and the first NMOS transistor are connected together; and the gates of the second PMOS transistor and the second NMOS transistor are connected together. The first PMOS and NMOS transistors are cross-coupled with the second PMOS and NMOS transistors. Specifically, a first output is connected to the node between the first PMOS transistor and the first NMOS transistor and to the gates of the second PMOS transistor and second NMOS transistor; and a second output is connected to the node between the second PMOS transistor and the second NMOS transistor and to the gates of the first PMOS transistor and the first NMOS transistor. A reference resistance is connected to one of the inputs; and the device whose resistance is being compared with the reference resistance is connected to the other of the inputs. Advantageously, the two outputs of the comparator are provided to a differential amplifier that produces a buffered, single-ended signal indicating whether the reference resistance is greater than or less than that of the device whose resistance is being compared.

In one embodiment, the sensing circuit further comprises at least a fuse and a reference resistor wherein the fuse and the reference resistor are connected to the first and second inputs, respectively, of the comparator. The resistance of the reference resistor is chosen to be between the resistance of the fuse in its unprogrammed (unblown or intact) state and the resistance of the fuse in its programmed (blown) state. As a result, when the fuse and the reference resistor are connected to a voltage supply, a voltage difference is produced at the first and second outputs of the comparator that is amplified by the differential amplifier and used to generate an output indicative of the state of the fuse.

Circuitry for programming the fuse is advantageously part of the sensing circuit as well.

The invention may be practiced with any type of fuse including those that are laser programmable such as metal fuses and those that are electrically programmable such as polysilicon (poly) fuses. The invention may also be used to compare the resistance of other circuit elements with the reference resistance and, in general, to compare the resistance of a device under test (DUT) with the reference resistance.

BRIEF DESCRIPTION OF THE DRAWINGS

These and other objects, features and advantages of the present invention will be more readily apparent from the following Detailed Description in which.

DETAILED DESCRIPTION

Figure 1:
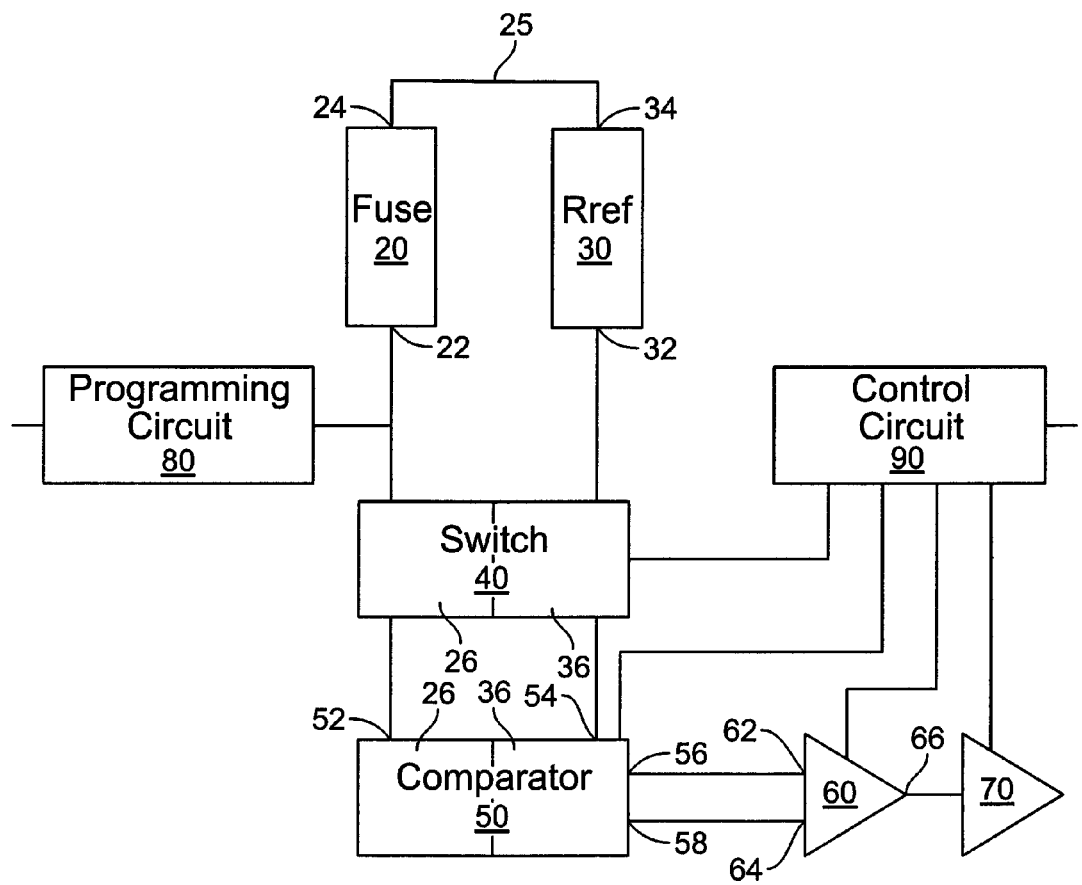
FIG. 1 is a block diagram of an illustrative embodiment of the invention.

FIG. 1 is block diagram of an illustrative sensing circuit 10 of the present invention. Circuit 10 comprises a fuse 20, a reference resistance 30, a switch 40, a comparator 50, an amplifier 60, and an output buffer 70. Circuit 10 further comprises a programming circuit 80 for programming fuse 20 and a control circuit 90 for controlling switch 40, comparator 50, amplifier 60 and output buffer 70. In the case where fuse 20 is a polysilicon (or poly) fuse or a copper fuse, the resistance of the fuse in its unprogrammed state is typically in the range of 100 to 200 Ohms. In its programmed state, the minimum resistance of the fuse is typically in the range of 2,000 to 10,000 Ohms. For these resistance values for fuse 20, a typical resistance value for resistance 30 is approximately 900 Ohms.

Comparator 50 has first and second inputs 52, 54 and first and second outputs 56, 58; and amplifier 60 has first and second inputs 62, 64 and at least a first output 66. The first and second outputs 56, 58 of amplifier 50 are connected to the first and second inputs of amplifier 60. A first terminal 22 of fuse 20 is connected via switch 40 to first input 52 of comparator 50 and a first terminal 32 of reference resistance 30 is connected via switch 40 to second input 54 of comparator 50. A second terminal 24 of fuse 20 and a second terminal 34 of reference resistance 30 are connected together at a first node 25. In a functioning circuit, node 25 is connected to a power supply. The internal circuitry of switch 40 and comparator 50 includes a fuse channel 26 and a reference channel 36 that preferably have substantially the same components and substantially the same resistance. In a preferred embodiment, the resistance of resistor 30 is chosen so that it is approximately midway between the resistance of fuse 20 in its unprogrammed state and the resistance of fuse 20 in its programmed state; but the invention is operable over a range of resistance values subject to constraints imposed by process, voltage and temperature PVT) variations.

Circuit 10 operates as follows. Fuse 20 may be programmed (or blown) by passing a large electrical current through it. This is done by turning on programming circuit 80 in response to an input signal.

The state of fuse 20 is read by applying a sensing signal to control circuit 90. Upon receiving such a signal, control circuit closes switch 40 and thereby connects the first terminals of fuse 20 and resistance 30 to the first and second inputs 52, 54 of comparator 50. The control circuit also activates comparator 50, amplifier 60, and buffer 70. In the case where fuse 20 is unprogrammed, the resistance of fuse channel 26 is less than that of reference channel 36. Conversely, in the case where fuse 20 is programmed, the resistance of fuse channel 26 is more than that of reference channel 36. As a result, the difference between the signals applied to inputs 52, 54 of comparator 50 has one polarity when fuse 20 is unprogrammed and the opposite polarity when fuse 20 is programmed. This difference is detected by comparator 50 and provided via outputs 56, 58 to inputs 62, 64 of amplifier 60 in the form of a differential signal having one polarity in the case where the fuse is unprogrammed and the opposite polarity in the case where the fuse is programmed. Amplifier 60 amplifies the differential signal and produces a single-ended output signal on output 66 to buffer 70. As detailed below, in the specific implementation of FIG. 1 that is shown in FIG. 2, the voltage at input 62 of amplifier 60 is higher than that at input 64 when the fuse is unprogrammed and lower than that at input 64 when the fuse is programmed.

Figure 2:
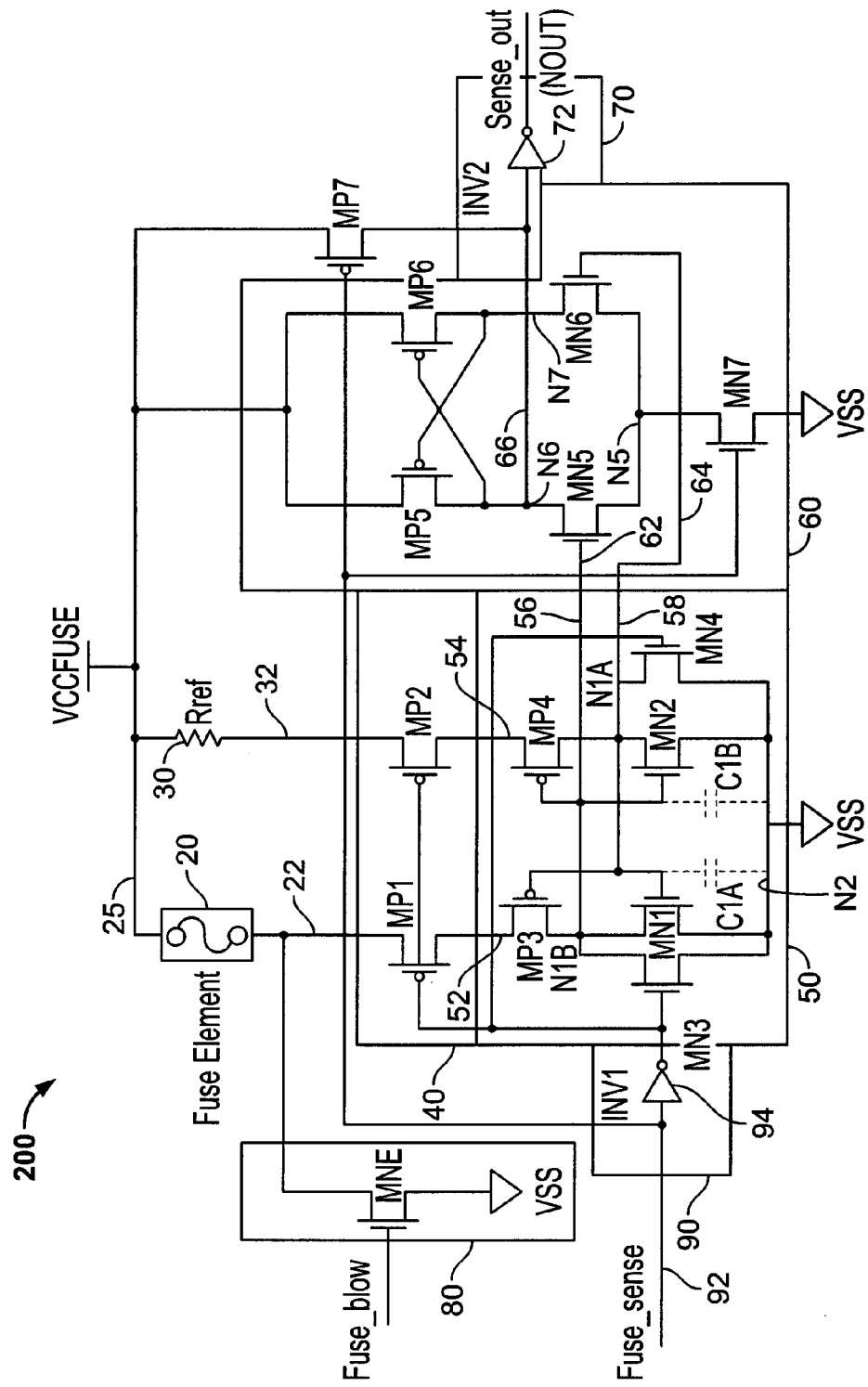
FIG. 2 is a schematic diagram of the circuit of FIG. 1.

FIG. 2 is a schematic diagram of a circuit 200 that implements the block diagram of FIG. 1. In FIG. 2 the elements that correspond to elements of FIG. 1 are identified by the same number. As will be apparent, circuit 200 comprises several MOS transistors, each of which includes a source, a drain, and a gate.

Switch 40 comprises first and second PMOS transistors MP1 and MP2 connected respectively between the first terminal 22 of fuse 20 and the first input 52 of comparator 50 and the first terminal 32 of resistance 30 and the second input 54 of comparator 50. Switch 40 is controlled by a signal from control circuit 90 that is applied to the gates of transistors MP1 and MP2.

Comparator 50 comprises third and fourth PMOS transistors MP3, MP4 and first, second, third, and fourth NMOS transistors MN1, MN2, MN3, MN4. The third PMOS transistor MP3 and the first NMOS transistor MN1 are connected in series between the first input 52 and a second node N2; and the fourth PMOS transistor MP4 and the second NMOS transistor MN2 are likewise connected in series between the second input 54 and the second node N2. Illustratively, the sources of the PMOS transistors MP3, MP4 are connected to the inputs 52, 54; the sources of the NMOS transistors MN1, MN2 are connected to second node N2, the drains of PMOS transistor MP3 and NMOS transistor MN1 are connected together at a third node N1B and the drains of PMOS transistor MP4 and NMOS transistor MN2 are connected together at a fourth node N1A. Further, the gates of PMOS transistor MP3 and NMOS transistor MN1 are connected together at node N1A; and the gates of PMOS transistor MP4 and NMOS transistor MN2 are connected together at node NIB. NMOS transistors MN3 and MN4, respectively, are connected between nodes N1B and N1A and node N2 and their gates are connected to one of the outputs of control circuit 90. Node N2 is connected to ground. Outputs 56, 58 of comparator are connected to nodes N1B and N1A, respectively.

Fuse channel 26 comprises PMOS transistors MP1, MP3; and reference channel 36 comprises PMOS transistors MP2, MP4. Preferably, transistors MP1 and MP2 are substantially identical and have substantially the same source-to-drain resistance; and transistors MP3 and MP4 are substantially identical and have substantially the same source-to-drain resistance. If desired, all four PMOS transistors may be substantially the same.

Amplifier 60 comprises fifth and sixth PMOS transistors MP5, MP6 and fifth, sixth, and seventh NMOS transistors MN5, MN6, and MN7. The fifth PMOS transistor MP5 and the fifth NMOS transistor MN5 are connected in series between the first node 25 and a fifth node N5; and the sixth PMOS transistor MP6 and the sixth NMOS transistor MN6 are likewise connected in series between the first node 25 and the fifth node N5. Illustratively, the sources of the PMOS transistors MP5, MP6 are connected to the first node 25, the sources of the NMOS transistors MN5, MN6 are connected to fifth node N5, the drains of PMOS transistor MP5 and NMOS transistor MN5 are connected together at a sixth node N6; and the drains of PMOS transistor MP6 and NMOS transistor MN6 are connected together at a seventh node N7. In addition, the PMOS transistors are cross-coupled so that the gate of PMOS transistor MP5 is connected to seventh node N7 and the gate of PMOS transistor MP6 is connected to sixth node N6. NMOS transistor MN7 is connected between node N5 and ground and its gate is connected to one of the outputs of control circuit 90. As shown in FIG. 2, output 66 of amplifier 60 is connected to the sixth node N6. Alternatively, it could be connected to seventh node N7.

Output buffer 70 comprises a first inverter 72 connected in series to output 66 of amplifier 60 and a seventh PMOS transistor MP7 connected between node 25 and an input to inverter 72. The gate of transistor MP7 is connected to one of the outputs of control circuit 90.

Programming circuit 80 comprises an NMOS transistor MN8 having a drain connected to first terminal 22 of fuse 20 and a source that is connected to ground. The programming circuit is controlled by a programming signal applied to the gate of transistor MN8.

Control circuit 90 comprises an input 92, a second inverter 94, and outputs to switch 40, comparator 50, amplifier 60 and buffer 70. Control circuit 90 is controlled by a sensing signal applied to input 92. Control circuit 90 applies the sensing signal to NMOS transistor MN7 of amplifier 60 and to PMOS transistor MP7 of buffer 70. It also applies the inverted sensing signal to PMOS transistors MP1, MP2 of switch 40 and NMOS transistors MN3, MN4 of comparator 50.

When the state of fuse 20 is not being sensed, the sensing signal is low, thereby turning off NMOS transistor MN7 and amplifier 60 and turning on PMOS transistor MP7. When PMOS transistor MP7 is on, a high signal is applied to inverter 72 of buffer 70, thereby producing a low output signal. The low sensing signal is also inverted by second inverter 94 to produce a high signal that turns off PMOS transistors MP1, MP2 and turns on NMOS transistors MN3, MN4, thereby grounding nodes N1B, N1A and turning on PMOS transistors MP4 and MP3, respectively. When the state of fuse 20 is to be sensed, a high sensing signal is applied to the input of control circuit 90. The high signal turns on NMOS transistor MN7, thereby turning on amplifier 60, and turns off PMOS transistor MP7, thereby enabling inverter 72 to invert the output of amplifier 60. The high sensing signal is also inverted by inverter 94 to produce a low signal that turns on PMOS transistors MP1, MP2 and turns off transistors MN3, MN4, thereby allowing comparator 50 to function.

Ordinarily, node 25 is connected to a positive power supply and the sensing signal is low with the result that PMOS transistors PM1, PM2 and NMOS transistor MN7 are off and PMOS transistor MP7 is on. Consequently, in this non-sensing state, there is no current flow in comparator 50 or amplifier 60 and the output signal from buffer 70 is low. To read the state of fuse 40, a high sensing signal is applied to control circuit 90. The high sensing signal turns off PMOS transistor MP7, thereby allowing the input to buffer inverter 72 to be controlled by the output 66 of amplifier 60, and it connects node N5 of amplifier 60 to ground. The sensing signal is also inverted by inverter 94 to produce a low signal that turns on PMOS transistors MP1, MP2, thereby connecting the fuse and the reference resistance to comparator 50, and it turns off NMOS transistors NM3, NM4, thereby allowing nodes N1B and N1A to float. At the time the sensing signal switches from low to high and circuit 200 enters its sensing state, PMOS transistors MP3, MP4 are both on. As a result, current flows through fuse 20 and PMOS transistors MP1, MP3 in fuse channel 26 to charge a parasitic capacitance C1B associated with node N1B; and current flows through reference resistance 30 and PMOS transistors MP2, MP4 in reference channel 36 to charge a parasitic capacitance C1A associated with node N1A.

As noted above, in the case where fuse 20 is unprogrammed, the resistance of fuse channel 26 is less than that of reference channel 36; and when fuse 20 is programmed, the resistance of fuse channel 26 is more than that of reference channel 36. As a result, the initial current flow through input 52 of comparator 50 is greater than the current flow through input 54 when fuse 20 is unprogrammed and is less than the current flow through input 54 when fuse 20 is programmed. Accordingly, when the fuse is unprogrammed, the voltage across the parasitic capacitance C1B and therefore the voltage at node N1B increases more rapidly than the voltage across parasitic capacitance C1A. This has the effect of turning off PMOS transistor MP4 and turning on NMOS transistor MN2 with the result that capacitance C1B is rapidly charged and capacitance C1A is not charged and all current flow through comparator 50 soon ceases. Thus, when the fuse is unprogrammed, the voltage at node N1B and at output 56 exceeds that at node N1A and output 58. Similarly, when the fuse is programmed and the initial current flow through input 54 of comparator 50 is greater than the current flow through input 52, the voltage across the parasitic capacitance C1A and therefore the voltage at node N1A increases more rapidly than the voltage across parasitic capacitance C1B. This has the effect of turning off PMOS transistor MP3 and turning on NMOS transistor MN1 with the result that capacitance C1A is rapidly charged and capacitance C1B is not charged and all current flow through comparator 50 soon ceases. Thus, when fuse 20 is programmed, the voltage at node N1A and output 58 exceeds that at node N1B and output 56.

The voltage signals at output terminals 56, 58 are applied to input terminals 62, 64 of amplifier 60 which are connected to the gates of NMOS transistors MN5, MN6, respectively. The sources of NMOS transistors MN5, MN6 are connected to ground by NMOS transistor MN7 that was turned on by the inverted sensing signal. The voltage difference between the signals applied to input terminals 62, 64 is amplified by amplifier 60 and used to produce an output signal at output 66 that either is close in value to that of the power supply or is close to ground. In particular, when the voltage signal at input 62 is higher than that at input 64 as is the case when the fuse is unprogrammed, NMOS transistor MN5 is made more conductive than NMOS transistor MN6. As a result, the voltage at node N6 and at output 66 approaches the ground voltage and since node N6 is connected to the gate of PMOS transistors MP6, this transistor becomes conductive, thereby raising the voltage at node N7 and cutting off PMOS transistor MP6. Conversely, when the voltage signal at input 62 is lower than that at input 64 as is the case when the fuse is programmed, NMOS transistor MN6 is made more conductive than NMOS transistor MN5. As a result, the voltage at node N7 approaches the ground voltage and since node N7 is connected to the gate of PMOS transistor MP5, this transistor becomes conductive, thereby raising the voltage at node N6 and output 66 to approximately that of the supply voltage and cutting off PMOS transistor MP6.

Thus, when the fuse is unprogrammed, the signal at output 66 of amplifier 60 is low; and when the fuse is programmed, the signal is high. The signal from output 66 is inverted by inverter 72 of buffer 70 to produce an output signal that is high when the fuse is unprogrammed and low when the fuse is programmed.

Figure 3:
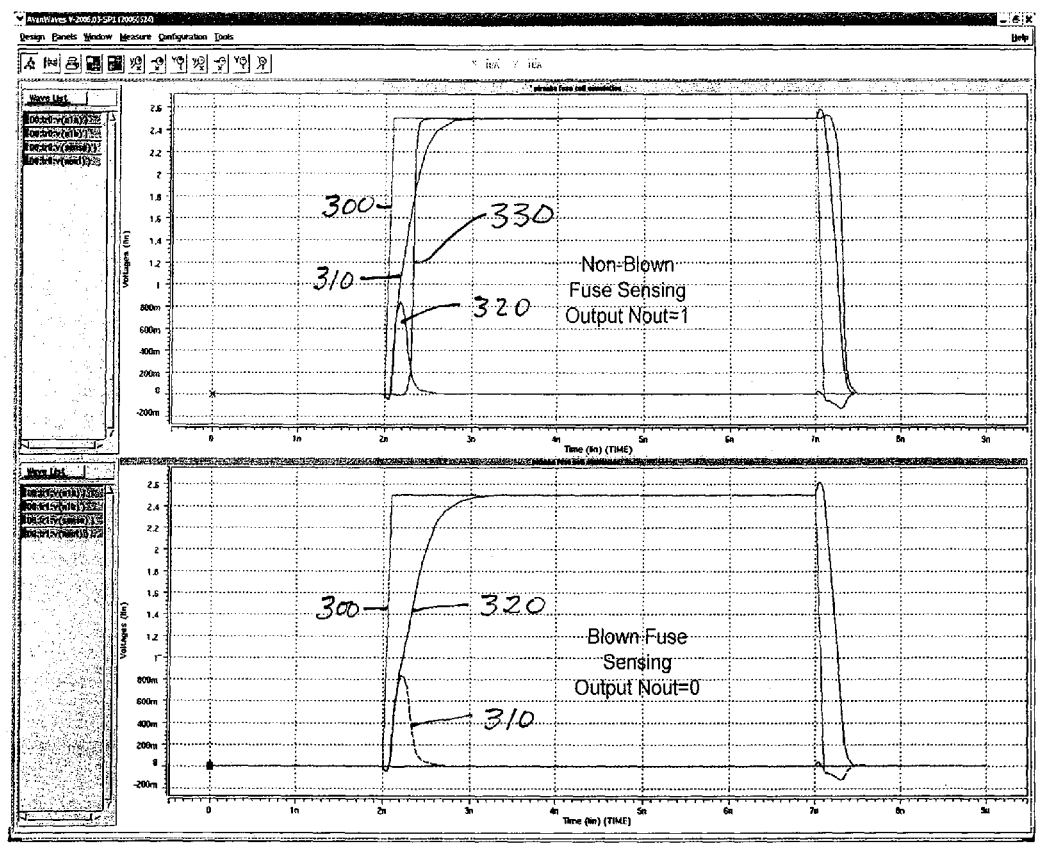
FIG. 3 is a simulation of the output waveform from the illustrative embodiment of FIG. 1.

FIG. 3 is a simulation of the output waveform from the circuit of FIGS. 1 and 2. The top panel depicts operation of the circuit when the fuse is unprogrammed and the bottom panel depicts its operation when the fuse is programmed. In both panels, the sensing signal 300 switches from low to high at 2 nanoseconds (2 ns) to activate fuse sensing. Prior to such switching, nodes N1A and N1B are both at ground. When the fuse is unprogrammed, node N1B charges up faster than node N1A. The voltage on node N1B is indicated by plot 310 and the voltage on node N1A is indicated by plot 320. The cross-coupling of node N1B to the gates of transistors MP4 and MN2 starts to turn off PMOS transistor MP4, thereby further decreasing the charging of node N1A and starts to turn on NMOS transistor MN2 thereby discharging node N1A to ground. Further, the coupling of node N1A to the gates of transistors MP3 and MN1 keeps PMOS transistor MP3 on and NMOS transistor MN1 off, which also favors the charging of node N1B over that of node N1A. As a result, node N1B is rapidly charged to the high state as indicated by plot 310 and node N1A is discharged to ground as indicated by plot 320. Nodes N1B, N1A are connected to inputs 62, 64 of amplifier 60 and the output of amplifier 60 is provided to buffer 70. As a result, as node N1B is charged and node N1A is discharged, the output of buffer 70 switches from low to high as indicated by plot 330.

When the fuse is programmed, node N1A charges up faster than node N1B. In this case the cross-coupling of node N1A to the gates of transistors MP3 and MN1 starts to turn off transistor MP3, thereby further decreasing the charging of node N1B, and turn on transistor MN1, thereby discharging node N1B to ground. Further, the coupling of node N1B to the gates of transistors MP4 and MN2 keeps PMOS transistor MP4 on and NMOS transistor MN2 off, which also favors the charging of node N1A over that of node N1B. As a result, node N1A is rapidly charged to the high state as indicated by plot 320 and node N1B is discharged to ground as indicated by plot 310. In this circumstance, the output of buffer 70 remains in the low state.

The invention may be practiced in numerous variations. While the preferred embodiment of the invention has been described as having a comparator and one stage of amplification, the invention may also be practiced with no amplification stages as well as with more than one stage of amplification. The preferred embodiment of the invention has been described with an output buffer that isolates the sensing circuit and facilitates connection to other circuits. In other applications, the invention may be practiced without such a buffer.

Advantageously, the circuit of the present invention includes circuitry for programming the fuse but other means can be used for such programming. Where the programming circuitry is included and the fuse is polysilicon, transistor MN8 must be large enough to sink the current needed to cause the electro-migration effect in the polysilicon and program the fuse. One advantage of the present invention is that the size of transistor MN8 can readily be adjusted to compensate for changes in properties of the fuse. With 40 nanometer (nm) polyfuses available today, NMOS transistor MN8 may be about 20 to 30 times larger than the NMOS transistors in comparator 50 and amplifier 60.

As indicated above, in the case where the resistances of fuse channel 26 and reference channel 36 are the same, the resistance of the reference resistor must be between the resistance of the fuse in its unprogrammed state and its resistance in its programmed state. Preferably, the resistance of the reference resistor is about midway between these limits. However, a range of variation in the reference resistance can be tolerated as long as the total resistance of the fuse channel and the fuse in its unprogrammed state is less than that of the reference channel and the reference resistance under worst case PVT conditions and the total resistance of the fuse channel and fuse in its programmed state is more than that of the reference channel and reference resistor under worst case PVT conditions.

The gain of the transistors in the differential amplifier depends on the sizes of the transistors in the amplifier. The use of multiple stages of differential amplifiers having gains that can readily be adjusted makes it possible to compensate for substantial variations in the circuit fabrication process, operating voltage and operating temperature of the circuit of the present invention.

As will be apparent to those skilled in the art numerous variations may be made within the spirit and scope of the present invention.

What is claimed is:

1. A sensing circuit comprising:
   first and second PMOS transistors, each having a source, a drain and a gate,
   first and second NMOS transistors, each having a source, a drain and a gate,
   the first PMOS transistor and the first NMOS transistor being connected in series between a first input and a first node with the gates of the first PMOS transistor and the first NMOS transistor connected together,
   the second PMOS transistor and the second NMOS transistor being connected in series between a second input and the first node with the gates of the second PMOS transistor and the second NMOS transistor being connected together,
   a first output connected to a second node between the first PMOS transistor and the first NMOS transistor and to the gates of the second PMOS transistor and the second NMOS transistor,
   a second output connected to a third node between the second PMOS transistor and the second NMOS transistor and to the gates of the first PMOS transistor and the first NMOS transistor,
   a fuse connected between a power supply and the first input;
   a reference resistance connected between the power supply and the second input, whereby voltages on the first and second outputs indicate whether the resistance of the fuse is greater than or lesser than the reference resistance; and
   a control circuit comprising third and fourth NMOS transistors, each having a source, a drain and a gate, the source and drain of the third NMOS transistor connected between the fuse and the first input and the source and drain of the fourth NMOS transistor connected between the reference resistance and the second input.

2. The sensing circuit of claim 1 further comprising a differential amplifier having first and second inputs to which the first and second outputs are connected.

3. The sensing circuit of claim 2 further comprising a buffer to which an output of the differential amplifier is connected.

4. The sensing circuit of claim 1 further comprising an output buffer connected to an output of the differential amplifier.

5. The sensing circuit of claim 1 wherein the fuse is a copper fuse.

6. The sensing circuit of claim 1 wherein the fuse is a polysilicon fuse.

7. The sensing circuit of claim 1 further comprising a circuit connected to the fuse for programming the fuse.

8. The sensing circuit of claim 1 wherein the first node is connected to ground.

9. The sensing circuit of claim 1 further comprising fifth and sixth NMOS transistors, each having a source, a drain and a gate, the fifth NMOS transistor connected between the second node and the first node and the sixth NMOS transistor connected between the third node and the first node, wherein the control circuit controls the gates of the fifth and sixth NMOS transistors.

10. A sensing circuit comprising:
    a fuse connected between a power supply and a first output;
    a reference resistance connected between the power supply and a second output;
    a comparator having first and second inputs and first and second outputs, the first input being connected to the first output of the fuse and the second input being connected to the second output of the reference resistance, wherein sensing current flows from the power supply, through the fuse and reference resistance, and through the first and second inputs and produces a signal on the first and second outputs that has a polarity indicating which of the first and second inputs had greater current flow; and
    a control circuit for switching the comparator between a sensing state and a non-sensing state comprising first and second NMOS transistors, each having a source, a drain and a gate, the source and drain of the first NMOS transistor connected between the fuse and first input and the source and drain of the second NMOS transistor connected between the reference resistance and the second input.

11. The sensing circuit of claim 10 further comprising an amplifier having first and second inputs and a first output, the first and second outputs of the comparator being connected to the first and second inputs of the amplifier.

12. The sensing circuit of claim 10 wherein the comparator comprises:

first and second PMOS transistors, each having a source, a drain and a gate, third and fourth NMOS transistors, each having a source, a drain and a gate, the first PMOS transistor and the third NMOS transistor being connected in series between the first input and a first node with the gates of the first PMOS transistor and the third NMOS transistor connected together, the second PMOS transistor and the fourth NMOS transistor being connected in series between the second input and the first node with the gates of the second PMOS transistor and the fourth NMOS transistor being connected together, the first output being connected to a second node between the first PMOS transistor and the third NMOS transistor and to the gates of the second PMOS transistor and the fourth NMOS transistor, and the second output being connected to a third node between the second PMOS transistor and the fourth NMOS transistor and to the gates of the first PMOS transistor and the third NMOS transistor.

13. The sensing circuit of claim 10, wherein the first and second outputs of the comparator are grounded in the non-sensing state.

14. A fuse sensing circuit comprising a comparator having first and second inputs and first and second outputs;

an amplifier having first and second inputs and at least a first output, the first and second outputs of the comparator being connected to the first and second inputs of the amplifier;

a fuse connected at one end to the first input of the comparator and at a second end to a power supply; and a reference resistance connected at one end to the second input of the comparator and at a second end to the power supply, first and second NMOS transistors, each having a source, a drain and a gate, the source and drain of the first NMOS transistor connected between the fuse and the first input of the comparator and the source and drain of the second NMOS transistor connected between the reference resistance and the second input of the comparator, whereby the comparator generates an output signal on its first and second outputs indicative of whether the fuse is programmed or not and the amplifier generates an output signal on its first output indicative of whether the fuse is programmed or not.

15. The fuse sensing circuit of claim 14 further comprising a circuit connected to the fuse for programming the fuse.

16. The sensing circuit of claim 14 wherein the reference resistance has a resistance between the resistance of the fuse in its unprogrammed state and the resistance of the fuse in its programmed state.

* * * * *